(12) United States Patent
Althaus et al.

(10) Patent No.: US 6,973,110 B2
(45) Date of Patent: Dec. 6, 2005

(54) MONOLITHIC LASER CONFIGURATION

(75) Inventors: Hans-Ludwig Althaus, Lappersdorf (DE); Bernd Borchert, deceased, late of Moosburg (DE); by Inka Catrin Borchert, legal representative, Moosburg (DE); Sybille Fidorra, Berlin (DE); Klemens Janiak, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/372,987

(22) Filed: Feb. 24, 2003

(65) Prior Publication Data

US 2003/0161371 A1 Aug. 28, 2003

(30) Foreign Application Priority Data

| Feb. 22, 2002 | (DE) | ............................. 102 08 433 |
| Feb. 28, 2002 | (DE) | ............................. 102 09 063 |

(51) Int. Cl.⁷ ............................................... H01S 5/00
(52) U.S. Cl. ................................................. 372/50
(58) Field of Search ................................. 372/50, 108

(56) References Cited

U.S. PATENT DOCUMENTS

| 4,718,070 A * | 1/1988 | Liau et al. ..................... 372/50 |
| 4,869,780 A * | 9/1989 | Yang et al. ............. 204/192.34 |
| 4,901,329 A * | 2/1990 | Leas ............................ 372/50 |
| 5,100,220 A * | 3/1992 | Voegeli ........................ 385/14 |
| 5,159,603 A * | 10/1992 | Kim ............................. 372/45 |
| 5,163,113 A | 11/1992 | Melman ....................... 385/31 |
| 5,191,590 A * | 3/1993 | Kuindersma et al. .......... 372/50 |
| 5,253,263 A * | 10/1993 | Jansen et al. .................. 372/45 |
| 5,258,991 A | 11/1993 | Peterson ....................... 372/50 |
| 5,479,426 A * | 12/1995 | Nakanishi et al. ............ 372/43 |
| 5,671,243 A * | 9/1997 | Yap .............................. 372/50 |
| 5,727,009 A * | 3/1998 | Tajiri et al. ................... 372/43 |
| 5,903,529 A * | 5/1999 | Nishi et al. .............. 369/44.23 |
| 6,081,638 A | 6/2000 | Zhou .......................... 385/31 |
| 6,115,398 A * | 9/2000 | Jiang .......................... 372/43 |
| 6,130,979 A | 10/2000 | Isaksson et al. ............. 385/89 |
| 6,185,239 B1 | 2/2001 | Ijuin et al. .................... 372/50 |
| 6,236,669 B1 * | 5/2001 | Nakanishi et al. ............ 372/43 |
| 6,449,296 B1 * | 9/2002 | Hamasaki et al. ........... 372/36 |
| 6,459,716 B1 * | 10/2002 | Lo et al. ....................... 372/50 |
| 6,556,608 B1 * | 4/2003 | Gilliland et al. .............. 372/50 |
| 2001/0024462 A1 | 9/2001 | Nakahara et al. ............. 372/43 |
| 2002/0003824 A1 * | 1/2002 | Lo et al. ....................... 372/50 |

FOREIGN PATENT DOCUMENTS

| EP | 0 645 650 B1 | 3/1995 |
| EP | 1 146 570 A1 | 10/2001 |
| GB | 2 120 457 A | 11/1983 |
| WO | WO 01/93385 A2 | 12/2001 |

\* cited by examiner

*Primary Examiner*—Minsun Oh Harvey
*Assistant Examiner*—James Menefee
(74) *Attorney, Agent, or Firm*—Laurence A. Greenberg; Werner H. Stemer; Ralph E. Locher (57) ABSTRACT

A monolithic laser configuration has a substrate, a laser diode disposed on the substrate for generating a light beam, a photodetector disposed on the substrate in the path of the light beam for receiving at least one part of the light beam, and a deflection device disposed on the substrate for deflecting the light beam substantially perpendicularly to the substrate surface. The monolithic laser configuration can advantageously be used in a coupling module with a plastic SMT housing of a standard configuration, it being possible to produce the optical access through an opening in the leadframe of the coupling module.

20 Claims, 9 Drawing Sheets

Fig. 8       Table 1

BASIC EPITAXY

| No. | Material | Band gap λ$_G$ (nm) | Thickness (nm) | Doping (cm$^{-3}$) |
|---|---|---|---|---|
| 1 | Substrate | | 3.6E5 | S |
| 2 | InP buffer | | 1100 | Si: 5 × 10$^{17}$ |
| 3 | Active layer | | 250 | |
| 4 | InP | | 60 | Zn: 5 × 10$^{17}$ |
| 5 | InGaAsP | 1100 | 30 | Zn: 5 × 10$^{17}$ |
| 6 | InP | | 30 | Zn: 5 × 10$^{17}$ |
| 7 | InGaAs | 1650 | 30 | Zn: 5 × 10$^{17}$ |
| 8 | InP | | 100 | Zn: 5 × 10$^{17}$ |

Fig. 9       Table 2 p-n BLOCKING EPITAXY

| No. | Layer | Thickness (nm) | Doping (cm$^{-3}$) |
|---|---|---|---|
| 1 | InP | Z | Zn: 5 × 10$^{17}$ Si: 3 × 10$^{16}$ |
| 2 | InP | 200 | Si: 5 × 10$^{18}$ |

Fig. 10   Table 3

CLADDING EPITAXY

| No. | Layer | Band gap λ (nm) | Thickness (nm) | Doping (cm$^{-3}$) |
|---|---|---|---|---|
| 1 | InP |  | 3000 - 4000 | Zn: $5 \times 10^{17}$ |
| 2 | InGaAsP | 1300 | 50 | Zn: $1 \times 10^{18}$ |
| 3 | InGaAs | 1650 | 200 | Zn: $1 \times 10^{19}$ |
| 4 | InP |  | 20 | Zn: $5 \times 10^{17}$ |
| 5 | InGaAs | 1650 | 500-1300 | undoped |
| 6 | InGaAs | 1650 | 200 | Si: $2.5 \times 10^{18}$ |

MONOLITHIC LASER CONFIGURATION

BACKGROUND OF THE INVENTION

Field of the Invention

The invention relates to a monolithic laser configuration, a coupling module, and to a method for producing the monolithic laser configuration.

In particular, but not exclusively, the invention relates to a monolithic laser configuration having a substrate, a laser diode disposed on the substrate for generating a light beam, a photodetector disposed on the substrate in the path of the light beam for receiving at least part of the light beam, and a deflection device disposed on the substrate for deflecting the light beam substantially perpendicularly to the substrate surface. The monolithic laser configuration can advantageously be used in a coupling module with a plastic SMT housing of a standard configuration, it being possible to produce the optical access through an opening in a leadframe of the couple module.

The invention is concerned with the problems which result from the particular features of the construction of components with edge-emitting semiconductor laser diode chips for optical information transmission.

Laser diodes (LD) in metal housings (e.g. "butterfly" laser diodes, dual inline (DIL) laser diodes, TO laser diodes, etc.) are known in which the light-emitting window of the LD chip is coupled via air with suitable optical elements (e.g. glass or Si lenses, fiber tapers) to an optical fiber (i.e. a single mode fiber (SMF)). This requires a housing technology with correspondingly dense optical fiber feeding as far as the LD chip, or else a housing (TO) hermetically sealed with a window, and a corresponding optical configuration which images the output of the laser diode through the window onto the optical fiber.

Such housings are of complicated construction and expensive to produce.

Against this background, efforts are being made to reduce the complexity by using LD chips in the so-called leadframe technology in plastic surface mount technology (SMT) housings. In the case of such solutions, the LD chip is constructed on the leadframe and electrically connected to the associated connections by "standard wire bond" technology.

The optical connection of the LD chip is effected by an immersion adaptation to an optical deflection prism that optically deflects the beam and passes it through the silicon submount, which is transparent (for wavelengths >1.2 $\mu$m) through the optical access in the leadframe toward the outside. The optical coupling to an SMF can be affected by an Si lens placed directly on the Si submount, a monolithically integrated lens, or the like.

In the solution realized hitherto, e.g. in an O-TSSOP plastic SMT housing, however, the construction of the laser chip with a monitor diode (MD) and a deflection prism requires a hybrid mounting of the individual components (mounting of the microprisms on the Si submount and subsequent mounting of the individual chips LD and MD) and also a corresponding coupling by an immersion resin prior to the molding process of the SMT housing.

In this construction, too, the production is therefore complicated and expensive.

SUMMARY OF THE INVENTION

It is accordingly an object of the invention to provide a monolithic laser configuration that overcomes the above-mentioned disadvantages of the prior art devices and methods of this general type.

With the foregoing and other objects in view there is provided, in accordance with the invention, a monolithic laser configuration. The laser configuration contains a surface, a laser diode for generating a light beam, a photodetector disposed in a path of the light beam and receiving at least one part of the light beam, and a deflection device receiving the light beam and deflecting the light beam substantially perpendicularly to the surface of the monolithic laser configuration.

A monolithic integration of the laser diode, of the photodetector, and of a deflection device for deflecting the light beam simplifies the construction of the laser configuration to a considerable extent. The photodetector is preferably disposed between the laser diode and the deflection device. Preferably the photodetector is offset with respect to a center axis of the light beam. The photodetector may be formed as a continuation of a laser layer.

In particular, the laser configuration may form a monolithic Fabry-Perot (FP), an edge-emitting, or a distributed feedback (DFB) laser chip that emits its light power perpendicularly to the mounting area.

The photodetector forms an integrated monitor chip that generates a control signal in the form of a photocurrent proportional to the light power.

The photodector is preferably disposed in the forward coupled-out light path of the laser diode. As a result, it is possible to completely avoid a coupling-out via the rear-side mirror of the laser diode. The rear-side mirror of the laser diode can therefore be 100% reflective, thereby increasing the efficiency of the laser diode.

In one refinement, the deflection device is realized by an interface on the semiconductor substrate of the laser configuration. The interface is configured in such a way that the light beam is directed through the substrate. As a result, the monolithic laser configuration may advantageously be disposed on a leadframe, it being possible to produce the optical access to the light path via an opening in the leadframe. The interface runs at an angle of approximately 45° relative to the surface of the laser configuration and is preferably a mirrored surface of the substrate.

Moreover, the monolithic laser configuration may have a covering or housing on the top side of the chip. The covering completely encloses the laser diode, the photodetector and the interface. The incorporation of the chip into a standard configuration is thereby simplified.

The covering may contain a transparent plastic and form an optically transparent solid body. All that is essential, however, is that the mirror trenches of the laser diode are filled with a transparent filling composition. A nontransparent plastic may also be applied above the latter in order to form a solid body. This has the advantage that standard tested plastics can be used, which are generally not transparent. In particular, it is thus possible to select a plastic with regard to its mechanical properties and independently of its optical properties. Thus it is possible to produce a stable solid body with a monolithic laser configuration in a simple manner.

Overall, the formation of a solid body made of plastic makes it possible to create a component with an edge-emitting chip which is constructed in a simple manner as a plastic SMT housing of a standard configuration.

The monolithic laser configuration can advantageously be used in a coupling module for coupling a laser diode to an optical conductor such as e.g. an optical fiber. The coupling module has a leadframe for connecting the laser configuration to a current source, and also a submount made of silicon that is disposed thereon. The monolithic laser configuration is disposed on the submount. The leadframe may have a cutout through which the light beam can be passed by the deflection device.

Consequently, a component that radiates perpendicularly to the mounting plane with its electrical connections can be realized in a simple manner.

The coupling module may furthermore have a lens in the light path of the light beam in the region of the cutout in the conductor element. The lens makes it possible to improve the coupling of the laser diode to the optical waveguide.

The lens may also be monolithically integrated into the silicon submount, for example by etching.

The invention additionally provides a method for producing a monolithic laser configuration, the deflection device being produced by creating an interface by etching into the semiconductor substrate of the laser configuration. The interface forms a mirror for beam deflection. The semiconductor substrate preferably contains InP and corresponding epitaxial layers. An HCl—HBr etching solution may be used for etching into the semiconductor substrate. The mixture ratio of HCl to HBr is preferably two to one. The temperature during etching is preferably approximately 5° Celsius.

To summarize, the significance of the invention consists in the configuration and in the production of the optically active interfaces for the beam deflection downward at the monolithically integrated laser monitor chip, and also in the monolithic integration of the monitor chip through photolithography and epitaxy.

Two advantages of the invention can be seen, in particular, in the fact that:

a) a complete monolithic integration of a laser with vertical radiation is achieved; the laser chip can then be incorporated into conventional plastic SMT housings in a simple manner; and b) an edge-emitting LD chip is provided which can be processed completely on a wafer and which, with its integrated monitor function, can already be tested completely on the wafer at the process stage, so that use can be made of all possibilities of known wafer processes for semiconductor chips.

Other features which are considered as characteristic for the invention are set forth in the appended claims.

Although the invention is illustrated and described herein as embodied in a monolithic laser configuration, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
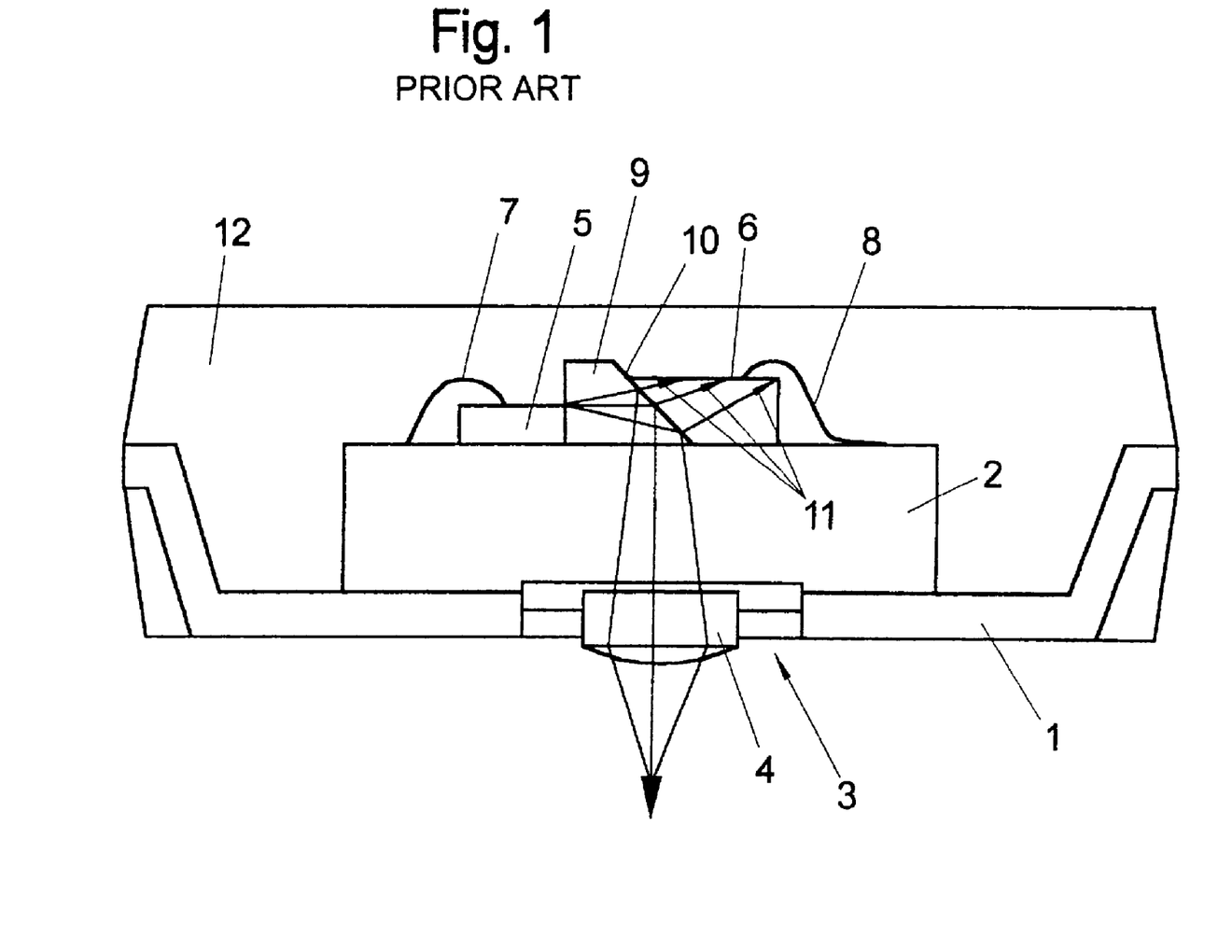
FIG. 1 is a diagrammatic, cross-sectional view through a conventional component.

Referring now to the figures of the drawing in detail and first, particularly, to FIG. 1 thereof, there is shown diagrammatically a cross section view through a conventional component having a leadframe 1, a submount 2 disposed thereon, and an optical configuration 4 which is disposed in a cutout 3 of the leadframe 1 and serves for focusing an output light beam. Disposed on the submount 2 is a laser diode 5 and also a monitor diode 6 with electrical connections 7 and 8, respectively. A mirror element 9 is fitted in between the laser diode 5 and the monitor diode 6, with a partially reflective mirror surface 10 through which one part of the light generated by the laser diode 5 is reflected in the direction of the optical configuration 4, while another part is allowed to pass in a direction toward the monitor diode 6, as indicated by arrows 11. The laser diode 5, the monitor diode 6, and the mirror element 9 are covered by a covering or housing 12.

The laser diode 5, the monitor diode 6, and also the mirror element 9 are separate components.

Figure 2:
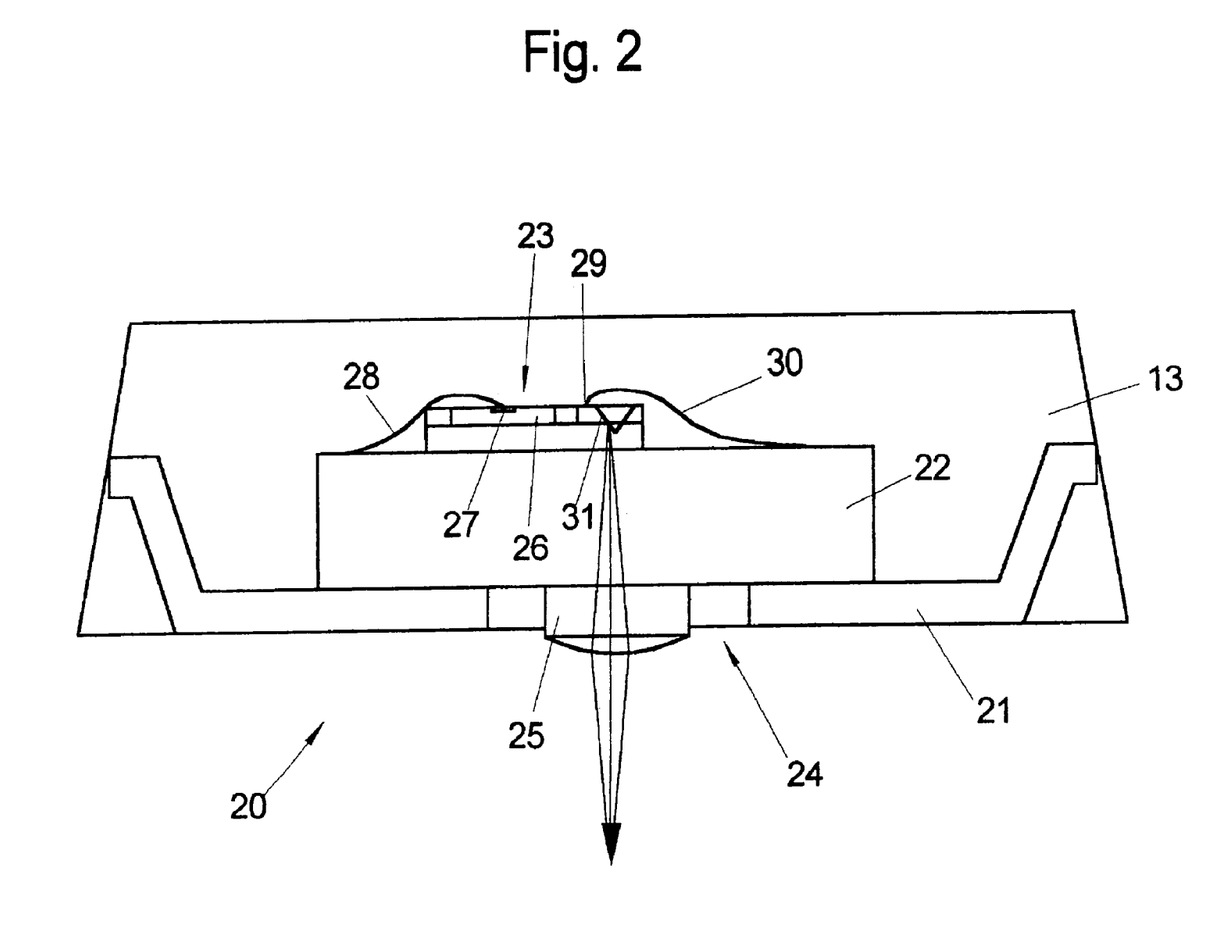
FIG. 2 is a diagrammatic, cross-sectional view through a coupling element according to an exemplary embodiment of the invention.

FIG. 2 diagrammatically shows a cross section through a coupling module 20 according to an exemplary embodiment of the invention. The coupling module 20 has a leadframe 21, a submount 22, and also a monolithic laser configuration 23 disposed thereon. Provided in the leadframe 21 is an opening 24 through which an optical output path of the laser configuration 23 is accessible. Provided in the opening 24 in the optical output path is a lens 25 that focuses, for example, the light beam generated by the laser configuration 23. Furthermore, a covering or housing 13 in the form of a plastic layer is applied on a top side of the laser configuration 23.

The laser configuration is produced monolithically and contains a laser diode 26 with an electrical contact 27 and an electrical lead 28, a monitor diode 29 with an electrical lead 30, and also a mirror surface 31 which is disposed downstream in the optical path of the light beam generated and deflects the light beam essentially perpendicularly to the surface of the laser configuration 23 through the submount 22 and the lens 25.

The coupling module 20 thus forms a complete laser diode-transmitter module component with coupling optical configuration for coupling to an SMF, other waveguides or further optical configurations, or free space.

Figure 3:
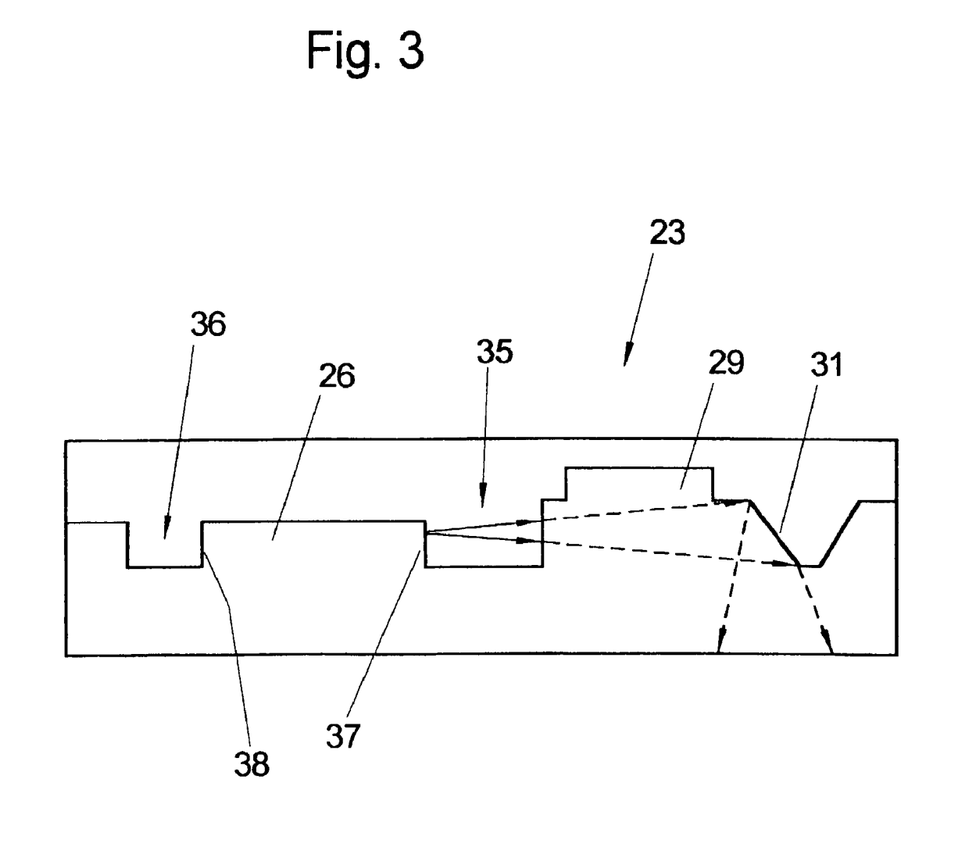
FIG. 3 is a diagrammatic, cross-sectional view through a monolithic laser configuration according to an exemplary embodiment of the invention.

FIG. 3 diagrammatically shows a cross section through the laser configuration 23 according to an exemplary embodiment of the invention. The laser configuration 23 is produced monolithically and contains the laser diode 26 and the monitor diode 29 already shown in FIG. 2. The laser diode 26 is delimited by a front mirror pit 35 and a rear mirror pit 36. The mirror pits 35 and 36 form a front mirror surface 37 and a rear-side mirror surface 38, respectively, of the laser diode 26.

The monitor diode 29 is disposed in the front-side light path of the laser diode 26. As a result, the rear-side mirror surface can be made completely reflective since no light from the laser diode 26 has to be projected onto a monitor diode located in the rear-side light path. This increases the efficiency of the laser diode 26.

The front-side mirror surface 37 allows a part of the generated light to pass through, which light impinges on the mirror surface 31, as indicated by the arrows.

By way of example, approximately 30–40% of the generated light is reflected back into the laser diode 26 by the mirror surface, while 60–70% impinges on the mirror surface 31. These values may vary depending on the mirroring.

The mirror surface 31 is at an angle of 45° with respect to the surface of the laser configuration 23. The mirror surface 31 deflects the generated light beam downward, i.e. perpendicularly to the surface of the laser configuration 23 through the semiconductor material, as is also illustrated in FIG. 2.

The monitor diode 29 is disposed with respect to the light path between the laser diode 26 and the mirror surface 31. The monitor diode 29 is offset relative to a center axis of the light beam (offset upward in the orientation shown in FIG. 3). The configuration of the monitor diode 29 is such that a part of the light beam is coupled out laterally and is incident on the monitor diode 29 (approximately 10% in one configuration). The output signal of the monitor diode 29 can accordingly be used for regulating the output power of the laser diode 26.

As an alternative to the configuration illustrated in FIG. 3, the monitor diode 29 may also be embodied as a continuation of the laser layer. This has the advantage that epitaxial layers and hence costs can be saved during production.

That part of the light beam that is not coupled out laterally is incident on the mirror surface 31.

Figure 4:
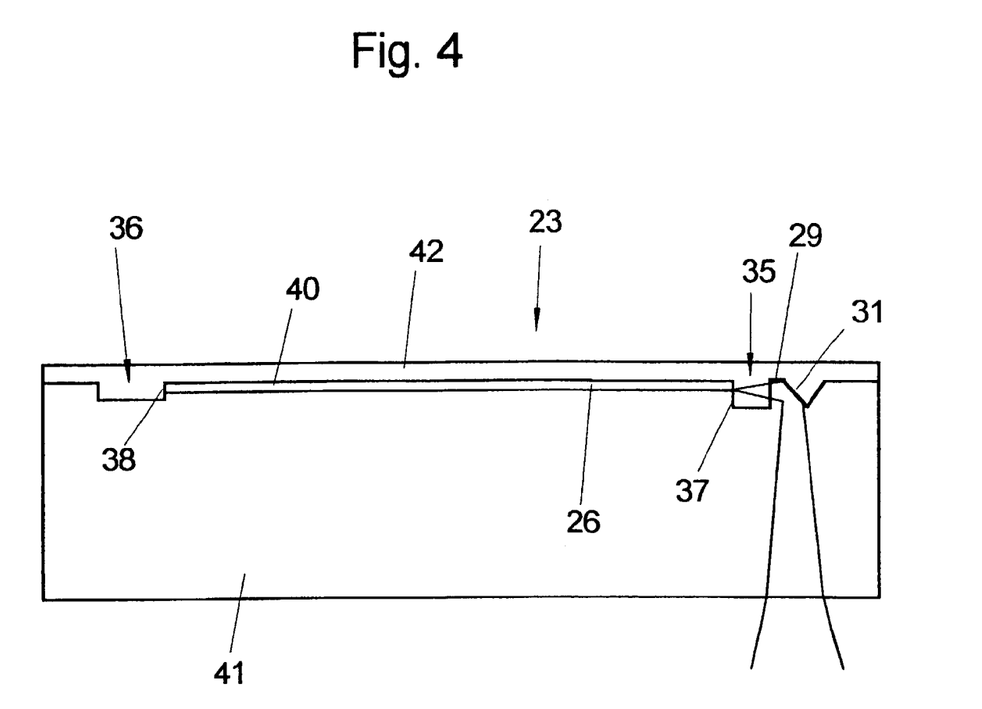
FIG. 4 is a diagrammatic, cross-sectional with beam guidance through the monolithic laser configuration according to an exemplary embodiment of the invention.

FIG. 4 diagrammatically shows a further cross section through the monolithic laser configuration 23 according to an exemplary embodiment of the invention. The laser configuration 23 is formed by an active zone 40 on a semiconductor substrate 41. A transparent covering layer 42 ("cladding") is applied on the laser diode 26, the monitor diode 29, the mirror surface 31, and also in the trenches 35 and 36. In particular, however, the covering layer 42 need only be transparent within the mirror trenches 35 and 36.

Figure 5:
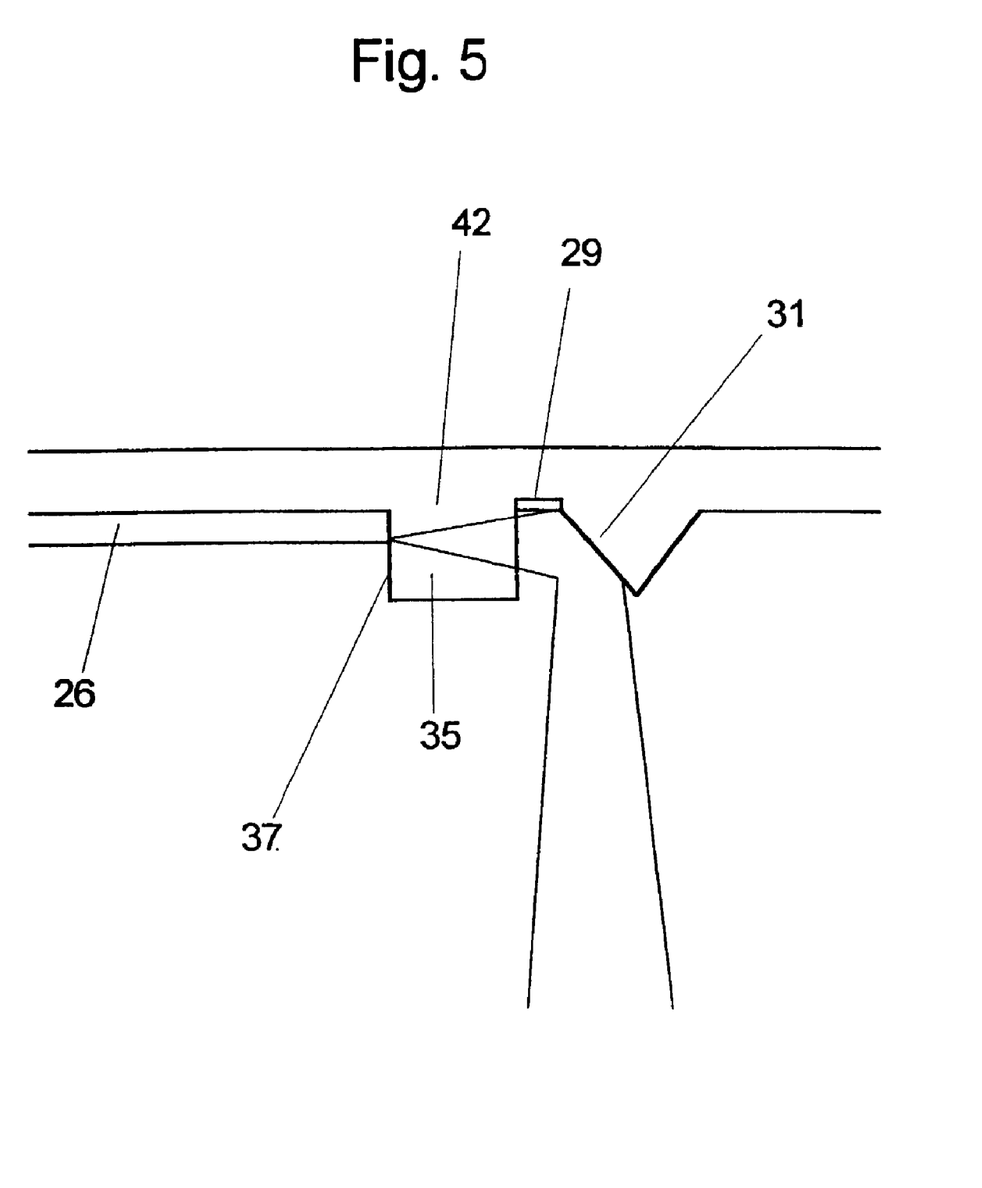
FIG. 5 is a diagrammatic, partial, cross-sectional view in a region of a deflection device in a beam path.

FIG. 5 shows a detail from the cross section through the monolithic laser configuration from FIG. 4 in the region of the monolithic beam deflection by the mirror surface 31. As already mentioned, a part of the light beam generated impinges on the monitor diode 29 located in the forward beam path of the laser diode 26.

Figure 6:
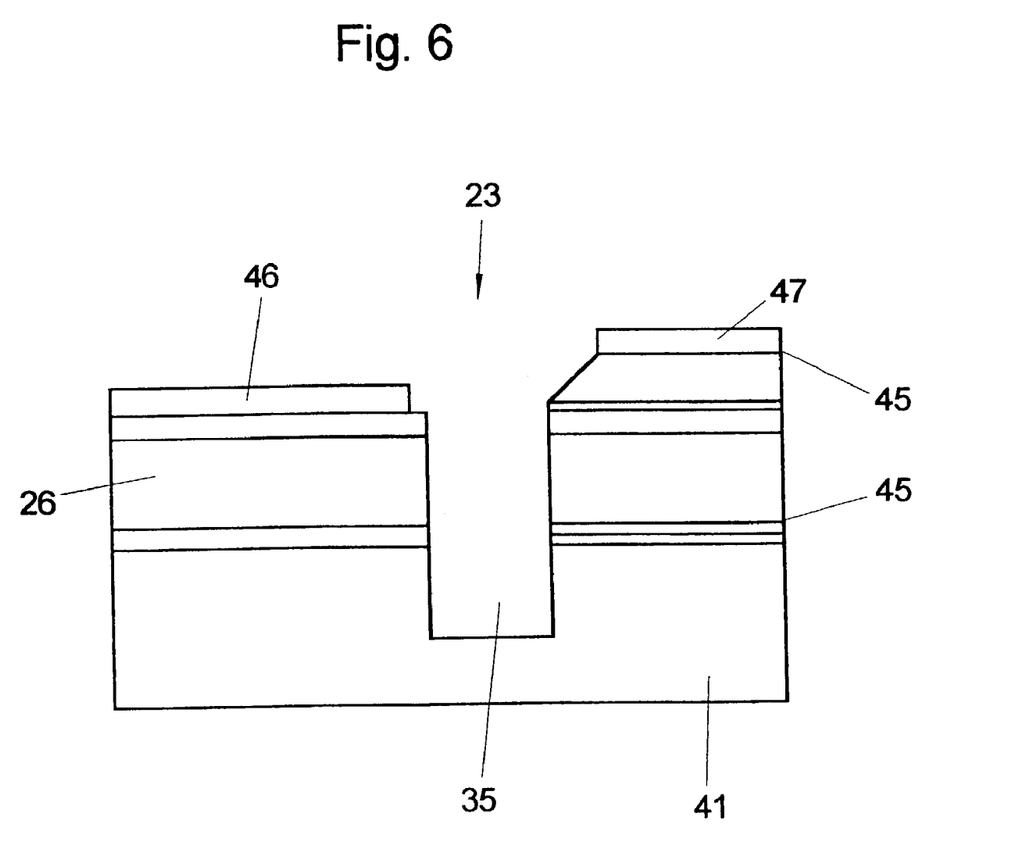
FIG. 6 is a diagrammatic, sectional view of a layer construction of the monolithic laser configuration.

FIG. 6 diagrammatically shows the layer construction of the monolithic laser configuration 23, in which case cladding layers 45, a contact 46 of the laser diode 26 (LD contact) and also a contact 47 of the monitor diode 29 (PD contact) are additionally illustrated.

Figure 7:
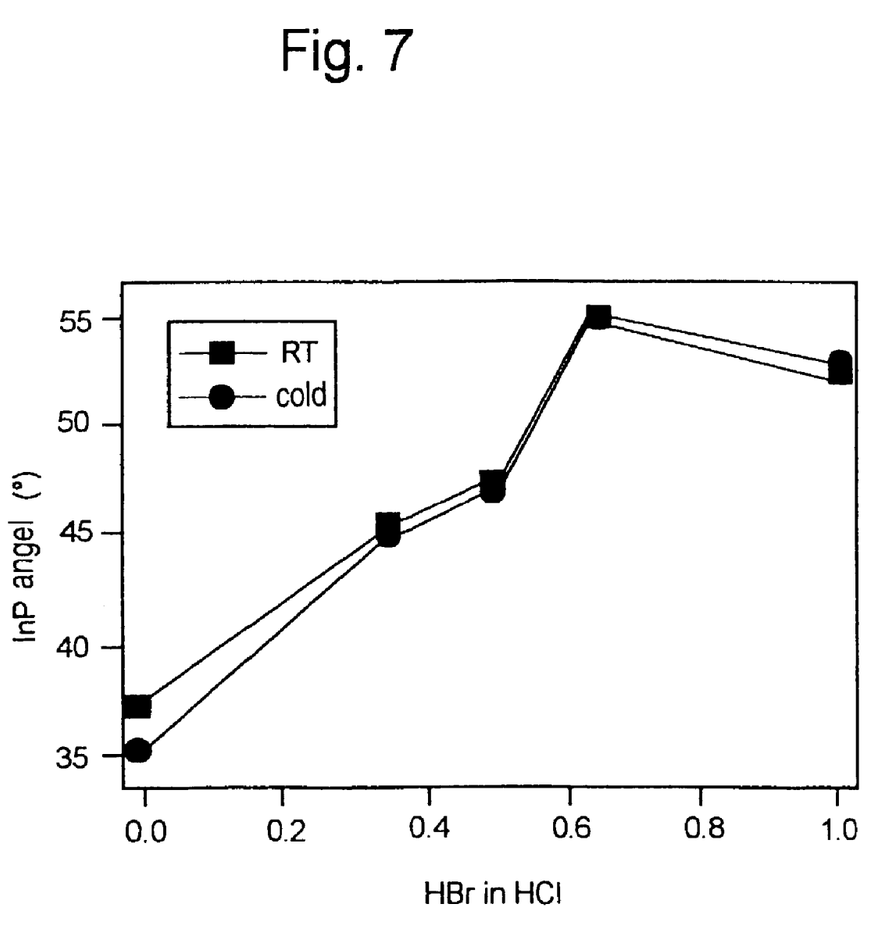
FIG. 7 is a graph showing a dependence of an InP etching angle on a HBr/HCl ratio in a production method according to an exemplary embodiment of the invention.

FIG. 7 is a graph illustrating the dependence of the InP etching angle on the HBr/HCl ratio at room temperature (RT) and 5° C. ("cold") during the production of the deflection area 31 illustrated in FIG. 4.

Figure 8:
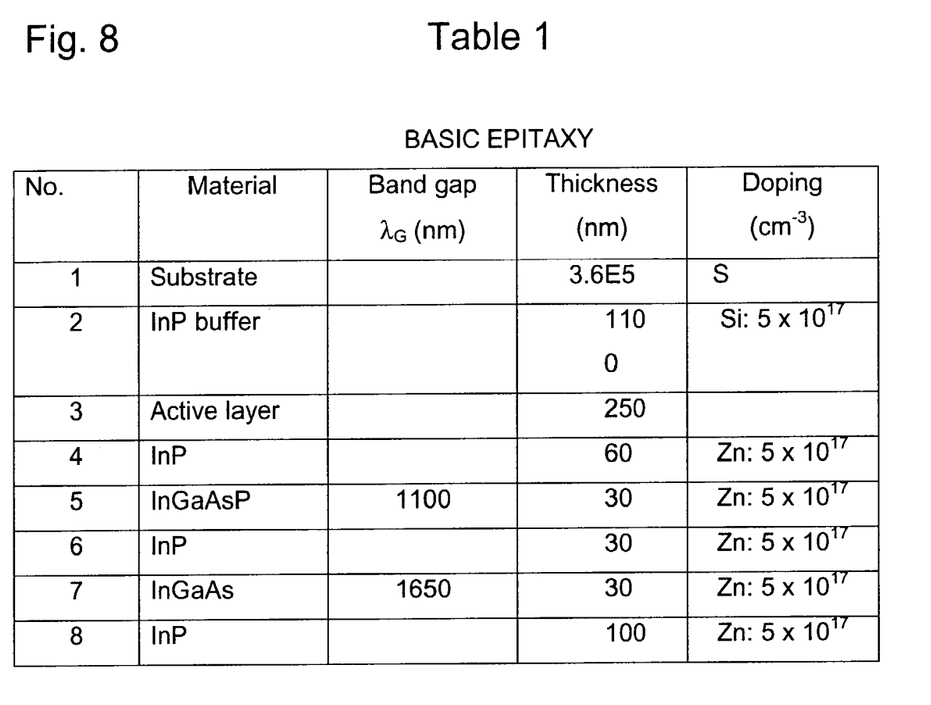
FIGS. 8–10 show Tables 1 to 3 illustrating expitaxy conditions during the production of a laser configuration according to an exemplary embodiment of the invention.
Figure 9:
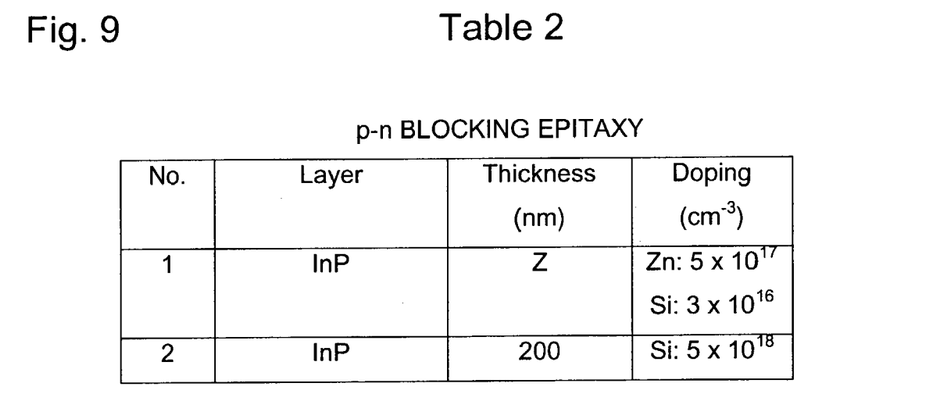
Figure 10:
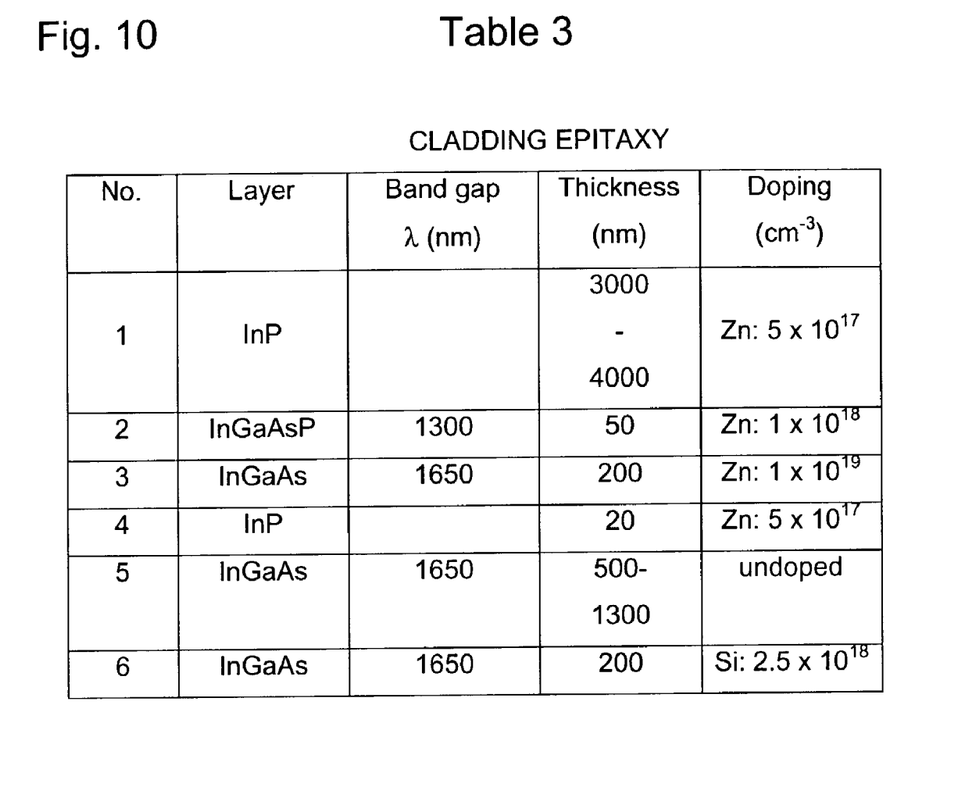

FIGS. 8–10 show Tables 1 to 3 illustrating expitaxy conditions during the production of the laser configuration according to an exemplary embodiment of the invention. Tables 1, 2 and 3 illustrate the method parameters during the basic epitaxy, the p-n blocking epitaxy, and the cladding epitaxy, respectively, during the production of the monolithic laser configuration. The epitaxy processes are followed by the patterning of the absorbing regions of the monitor diode (layer No. 5 and No. 6). A selective diffusion of the p-type contact layer of the laser, the layer then being situated at the top, is subsequently effected.

The n-type contact of the monitor diode is situated at the top in the case of this structure.

The invention is not restricted to the exemplary embodiments described, but rather encompasses modifications in the context of the scope of protection defined by the claims.

We claim:

1. A monolithic laser configuration, comprising:
    a surface;
    a laser diode for generating a light beam;
    a deflection device receiving the light beam and deflecting the light beam substantially perpendicularly to said surface of the monolithic laser configuration; and
    a photodetector disposed in a path of the light beam between said laser diode and said deflection device and receiving at least one part of the light beam, said photodetector detecting a portion of the light beam emitted from said laser diode before the light beam falls on said deflection device, said photodetector being offset with respect to a center axis of the light beam;
    said laser diode, said photodetector, and said deflection device being integrated monolithically in one component.

2. The monolithic laser configuration according to claim 1, wherein said photodetector is formed as a continuation of a laser layer.

3. The monolithic laser configuration according to claim 1, wherein said photodetector is disposed in a forward coupled-out light path of said laser diode.

4. The monolithic laser configuration according to claim 1, further comprising a housing covering said laser diode, said photodetector and said deflection device, said housing enclosing the beam path.

5. The monolithic laser configuration according to claim 1, wherein said laser diode includes an edge-emitting laser diode chip.

6. The monolithic laser configuration according to claim 1, wherein said laser diode includes a Fabry-Perot laser chip.

7. The monolithic laser configuration according to claim 1, wherein said laser diode is a distributed feedback laser chip.

8. The monolithic laser configuration according to claim 1, further comprising a substrate and said deflection device being formed by an interface of said substrate.

9. The monolithic laser configuration according to claim 8, wherein said interface runs at an angle of approximately 45° relative to the surface of the monolithic laser configuration.

10. The monolithic laser configuration according to claim 8, wherein said interface is a mirrored surface of said substrate.

11. A method for producing a monolithic laser configuration according to claim 1, which comprises the steps of:
    producing a semiconductor substrate;
    etching into the semiconductor substrate for producing an interface functioning as a deflection device.

12. The method according to claim 11, which further comprises:
forming the semiconductor substrate from InP and epitaxial layers; and
using an HCl—HBr etching solution during the etching step.

13. The method according to claim 12, which further comprises setting a mixture ratio of HCl to HBr to be approximately two to one.

14. The method according to claim 11, which further comprises carrying out the etching step at a temperature of approximately 5° Celsius.

15. A coupling module for coupling a light beam to an optical waveguide, the coupling module comprising:
a leadframe;
a submount disposed on said leadframe; and
a monolithic laser configuration disposed on said submount and, containing:
a surface;
a laser diode for generating a light beam;
a deflection device receiving the light beam and deflecting the light beam substantially perpendicularly to said surface; and
a photodetector disposed in a path of the light beam between said laser diode and said deflection device and receiving at least one part of the light beam, said photodetector detecting a portion of the light beam emitted from said laser diode before the light beam falls on said deflection device, said photodetector being offset with respect to a center axis of the light beam;
said laser diode, said photodetector, and said deflection device being integrated monolithically in one component.

16. The coupling module according to claim 15, wherein said leadframe has a cutout formed therein and through said cutout the light beam is deflected by said deflection device.

17. The coupling module according to claim 16, further comprising a lens disposed in the path of the light beam in a region of said cutout for optically influencing the light beam.

18. The coupling module according to claim 17, wherein said lens is monolithically integrated into said submount.

19. The coupling module according to claim 15, further comprising a surface mounted technology housing and said monolithic laser configuration is disposed in said surface mounted technology housing.

20. A laser configuration, comprising:
a surface;
a laser diode for generating a light beam;
a deflection device receiving the light beam and deflecting the light beam substantially perpendicularly to said surface of the monolithic laser configuration; and
a photodetector disposed in a path of the light beam between said laser diode and said deflection device and receiving at least one part of the light beam, said photodetector detecting a portion of the light beam emitted from said laser diode before the light beam falls on said deflection device, said photodetector being offset with respect to a center axis of the light beam.

* * * * *